United States Patent [19]
Fujii et al.

[11] Patent Number: 5,701,108
[45] Date of Patent: Dec. 23, 1997

[54] MAGNETOSTATIC WAVE DEVICE WITH A MAGNETIC FIELD APPLIED PARALLEL TO AN AXIS OF EASY MAGNETIZATION

[75] Inventors: Takashi Fujii, Ohtsu; Satoru Shinmura, Takatsuki; Masaru Fujino, Ohtsu; Shinobu Mizuno, Muko; Takenori Sekijima; Osamu Chikagawa, both of Nagaokakyo; Hiroshi Takagi, Ohtsu, all of Japan

[73] Assignee: Murata Manufacturing Co., Ltd., Japan

[21] Appl. No.: 649,930

[22] Filed: May 16, 1996

Related U.S. Application Data

[63] Continuation of Ser. No. 284,151, Aug. 2, 1994, abandoned.

[30] Foreign Application Priority Data

Aug. 3, 1993 [JP] Japan ................... 5-229727

[51] Int. Cl.$^6$ .................................. H01P 1/215
[52] U.S. Cl. .................................. 333/202
[58] Field of Search .................. 333/201, 202, 333/202 M, 204, 205

[56] References Cited

U.S. PATENT DOCUMENTS

| | | | |
|---|---|---|---|
| 4,853,660 | 8/1989 | Schloemann | 333/204 |
| 5,289,143 | 2/1994 | Tsutsumi | 333/204 |

FOREIGN PATENT DOCUMENTS

| | | |
|---|---|---|
| 143009 | 11/1980 | Japan. |
| 191108 | 7/1993 | Japan. |

OTHER PUBLICATIONS

Lax et al., *Microwave Ferrites and Ferrimagnetics*, 1962, pp. 467–468.

Adam et al., "Magnetostatic–Wave Group–Delay Equaliser," *Electronics Letters*, vol. 9, No. 24, 29 Nov. 73, pp. 557–578.

Primary Examiner—Benny Lee
Assistant Examiner—Justin P. Bettendorf
Attorney, Agent, or Firm—Ostrolenk, Faber, Gerb & Soffen, LLP

[57] ABSTRACT

A magnetostatic wave device has an external magnetic field applied in a direction that is substantially parallel to a plane of a thin film of a magnetic single-crystal having a garnet structure. The thin film of the magnetic single-crystal has an axis of easy magnetization that is oriented in substantially the same direction as the direction of the externally applied magnetic field.

11 Claims, 5 Drawing Sheets

MAGNETOSTATIC WAVE DEVICE WITH A MAGNETIC FIELD APPLIED PARALLEL TO AN AXIS OF EASY MAGNETIZATION

This is a Continuation of application Ser. No. 08/284,151, filed on Aug. 2, 1994 now abandoned.

BACKGROUND OF THE INVENTION

1. Field of the Invention

The present invention relates to a magnetostatic wave device and, more particularly, to a magnetostatic wave device comprising a thin film of a single-crystal magnetic garnet.

2. Description of the Prior Art

Thin films of single-crystal magnetic garnets such as yttrium-iron-garnet ($Y_3Fe_5O_{12}$, hereinafter referred to as "YIG") have been used as an essential material for magnetostatic wave devices because of their high saturation magnetization. Such magnetostatic wave devices are generally operated in one of three magnetostatic wave modes, i.e., magnetostatic surface waves (MSSW), magnetostatic forward volume waves (MSFVW), and magnetostatic backward volume waves (MSBVW), which are determined by the orientation of an externally applied magnetic field and the propagation direction of magnetostatic waves. The first MSSW mode is defined such that the orientation of the externally applied magnetic field is parallel to a plane of the single-crystal film, while the propagation direction of the magnetostatic waves is parallel to the plane of the single-crystal thin film but perpendicular to the externally applied magnetic field. The second, MSFVW mode is defined such that the orientation of the externally applied magnetic field is perpendicular to the plane of the single-crystal thin film, while the propagation direction of the magnetostatic waves is parallel to the plane of the single-crystal thin film. The third, MSBVW mode is defined such that the orientation of the externally applied magnetic field is parallel to the surface of the thin film, while the propagation direction of the magnetostatic waves is parallel to the plane of the single-crystal thin film and parallel to the magnetic field.

Up to now, regardless of the magnetostatic wave modes, all the magnetic garnet films used for such magnetostatic wave devices are thin (111) single-crystal films epitaxially grown in the direction of the [111] axis, which have been developed for the production of magnetic bubble memory devices. Such thin (111) single-crystal films make it possible to produce magnetostatic wave devices with good characteristics.

However, these results can be obtained only when the magnetostatic wave devices are designed to be operated in the MSFVW mode in which an external magnetic field is applied in the [111] direction of the crystal film. If such thin single-crystal films with the (111) plane are used for the production of magnetostatic wave devices to be operated in MSSW or MSBVW mode, there is a problem in that the characteristics vary widely with the device, resulting in low device yield. This problem may be overcome by adjusting the device to the desired characteristics, but it takes a long period of time.

SUMMARY OF THE INVENTION

It is therefore a main object of at least one of the preferred embodiments of the present invention to provide a magnetostatic wave device of the MSSW mode with stable filter characteristics.

It has now been found by the present inventors that scatters in characteristics of magnetostatic surface wave mode devices can be minimized by coinciding the direction of easy magnetization of the film with the direction of an externally applied magnetic field. This can be achieved by use of a thin magnetic single-crystal film formed so as to have an axis of easy magnetization oriented in the same direction as that of an externally applied magnetic field.

According to at least one of the preferred embodiments of the present invention, there is provided a magnetostatic wave device of the kind wherein an external magnetic field is applied to a thin film of a magnetic single-crystal having a garnet structure in the direction substantially parallel to a plane of this thin film, characterized in that the thin film of the magnetic single-crystal is formed so as to have an axis of easy magnetization oriented in the same direction as that of the externally applied magnetic field.

In a preferred embodiment of the present invention, the magnetostatic surface wave device includes a first transducer for signal inputs formed on a principal plane of said thin film of the magnetic singlecrystal; and a second transducer for signal outputs formed in parallel with the first transducer on said principal plane of the thin film of the magnetic single-crystal, the first and second transducers being so formed that they meet the axis of easy magnetization of the thin film at a certain angle.

The angle α between the first and second transducers and the axis of easy magnetization is generally determined so that the angle α ranges from about −5° to +5°.

The preferred embodiments of the present invention make it possible to improve the stability in filtering characteristics of magnetostatic surface wave mode devices. Thus, the magnetostatic wave devices of the preferred embodiments of the present invention are uniform in filtering characteristics, resulting in high device yield and lowering in production costs of the magnetostatic surface wave mode devices.

The above and other objects, features and advantages of the present invention will be apparent from the following explanation with reference to several embodiments thereof.

DETAILED DESCRIPTION OF PREFERRED EMBODIMENTS

Figure 1:
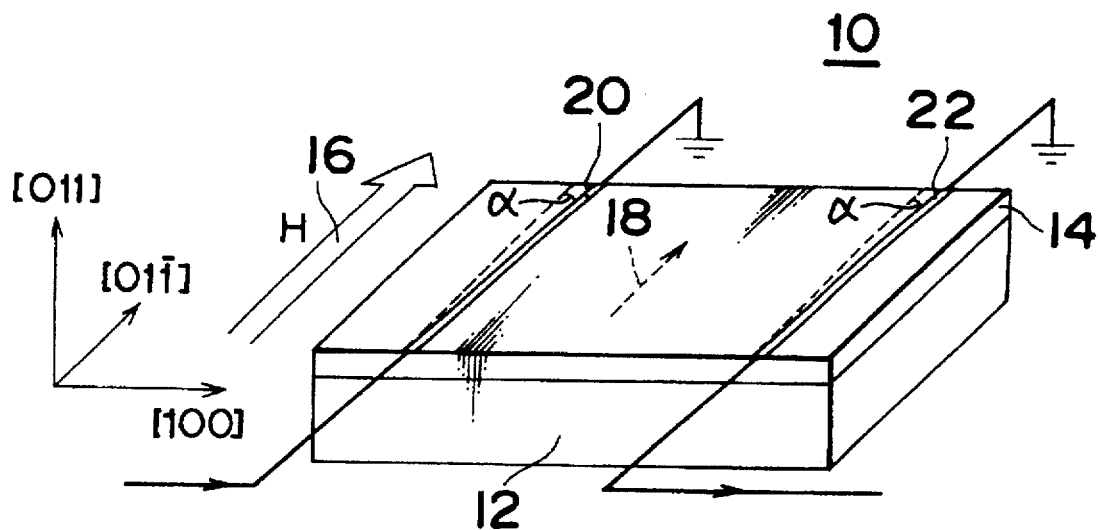
FIG. 1 is a perspective view of a magnetostatic wave element illustrating one preferred embodiment of the present invention.

Referring to FIG. 1, there is shown a magnetostatic wave element, generally indicated by 10, which preferably comprises a single-crystal substrate 12 of $Gd_3Ga_5O_{12}$ (hereinafter referred to as "GGG") having a garnet structure, and a thin film 14 of $Y_3Fe_5O_{12}$ single-crystal having a garnet structure, and first and second transducers formed on the thin film 14, i.e., an input transducer 20 and an output transducer 22 formed on the thin film 14 so that they meet the axis of easy magnetization of the thin film at a certain angle α.

Using a GGG single-crystal grown 2 in. in diameter in the [011] direction, the above GGG substrate 12 was prepared by cutting the GGG single crystal along the (011) plane thereof into a wafer of 450 μm in thickness, and polishing the (011) plane of the wafer.

The thin film 14 of YIG single-crystal having a garnet structure was formed on the (011) plane of the GGG substrate 12 by an epitaxial growth in the following manner. The YIG film is 25 μm in thickness for example.

Figure 2:
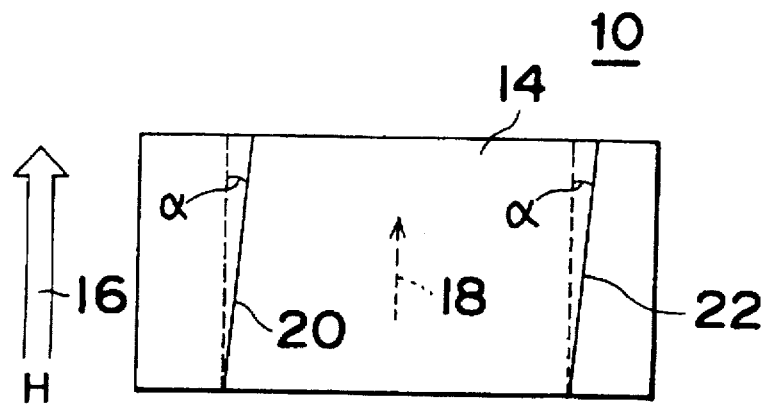
FIG. 2 is a plan view of the device of FIG. 1.

Raw materials for a solute, $Fe_2O_3$ and $Y_2O_3$, were weighed and mixed with a suitable amount of a solvent composed of PbO and $B_2O_3$. The resultant mixture was put in a platinum crucible, heated to 1200° C. in an electric furnace to prepare a homogeneous melt, cooled to and then maintained at a temperature of 900° C. at which the crystal growth occurs. Then, the GGG substrate 12 was immersed in the resultant supersaturated melt for a certain period of time, whereby a thin YIG film 14 was epitxially grown on the (011) plane of the GGG substrate 12 in the [011] direction. The GGG substrate 12 was then drawn up from the melt, rotated at a high rate of revolution to remove the melt from the surface of the thin YIG film 14, and then cooled to room temperature. After polishing the (011) plane of the thin YIG film 14, the substrate 12 was cut together with the thin YIG film 14 to prepare strips with 20 mm in the [100] direction and 5 mm in the direction of the [01$\bar{1}$] axis perpendicular to direction of the [100] axis, as shown in FIG. 2.

Then, an external magnetic field 16 is applied to the strip in the direction parallel to the (011) face of the thin film 14 of the single-crystal YIG and parallel to the [01$\bar{1}$] axis thereof, whereby the axis of easy magnetization 18 occurs in parallel to the externally applied magnetic field, i.e., in the direction of the [01$\bar{1}$] axis, as mentioned below with reference to FIGS. 6A and 6B.

The first transducer, i.e., input transducer 20, is provided on the thin film 14 of the single-crystal YIG in the direction of the externally applied magnetic field 16, i.e., at a certain angle α with respect to the [01$\bar{1}$] axis of the YIG single-crystal. This angle α is determined by considering the strength of the externally applied magnetic field 16, and magnitude and frequency of input signals. In this embodiment, the angle α is set to 1°. Similarly, the second transducer or output transducer 22 is provided on the thin film 14 of the single-crystal YIG in parallel with the input transducer 20 at a distance of 15 mm. Thus, an angle α between the output transducer 22 and the direction of the [01$\bar{1}$] axis of the YIG single-crystal is 1°.

For the magnetostatic wave device 10 having the configuration described above, filter characteristics were determined in the following manner. An external magnetic field of 30 mT was applied to the magnetostatic wave device 10 in the direction parallel to the direction of the [0$\bar{1}\bar{1}$] axis, i.e, short side of the device and then high-frequency signals are fed to the first transducer 20. The frequency range of the input signals was 1 to 10 GHz and the input power was 100 μW. The results showed that this device operates at 3.5 GHz with good filter characteristics. Further, the measurement of the filter characteristics for other ten specimens of the magnetostatic wave devices showed that all the magnetostatic wave devices operate at 3.5 GHz without adjustment of the operating frequency.

The above preferred embodiment refers to magnetostatic wave device operated in the MSSW mode in which the direction of the externally applied magnetic field H and the propagation direction of magnetostatic waves which propagate in the single-crystal ferrimagnetic film are substantially parallel to the single-crystal ferrimagnetic film and the direction of the externally applied magnetic field H is substantially perpendicular to the propagation direction of magnetostatic waves. When applying a magnetic field H to the device 10 in the direction parallel to the plane of the single-crystal ferrimagnetic film, a magnetic anisotropy energy U resulting therefrom is given by the equation:

$$U = -\vec{H}_{\mathit{eff}} \cdot \vec{M} \text{ (Indication by vector)}$$
$$= -|\vec{H}_{\mathit{eff}}| \cdot |\vec{M}| \cdot \cos\theta \text{ (Indication by inner product)}$$

where $H_{\mathit{eff}}$ is an effective magnetic field produced by the externally applied magnetic field H and the magnetic field $H_i$ resulting from the propagating magnetostatic waves, M is a magnetization vector produced by the effective magnetic field $H_{\mathit{eff}}$ in the direction of the axis of easy magnetization, and θ is an angle between the vector $H_{\mathit{eff}}$ and vector M.

Considering the amount of scatter in the accuracy of machining, the magnetostatic wave device having a rectangular configuration as shown in FIG. 1 has a energetically stable state when the thin single-crystal film is formed so as to have the axis of easy magnetization parallel to the thin single-crystal film.

As will be understood from the above equation, the magnetic anisotropy energy U becomes minimum when the direction of the effective magnetic field $H_{\mathit{eff}}$ coincides with that of the magnetization vector M oriented in the direction of the axis of easy magnetization. According to the preferred embodiments of the present invention, this is achieved by providing the first and second transducers 20, 22 on the thin film at a certain angle α with respect to the direction of the externally applied magnetic field.

In order to determine the optimum angle α for the magnetostatic wave device 10 comprising a thin YIG film epitaxially grown on a GGG substrate, there were prepared five kinds of magnetostatic wave devices in the same manner as above. These devices have the same configuration and size as those of the magnetostatic wave device 10 described above but differ from one another in an angle α between the transducers 20, 22 and the axis of easy magnetization. The transducers 20, 22 were formed on the thin YIG film at an angle α of −2°, −1°, 0°, 1°, or 2°. For each magnetostatic wave device 10, the measurement was made on loss of propagating signals. Results are plotted in FIG. 3 as a function of the angle α.

Figure 3:
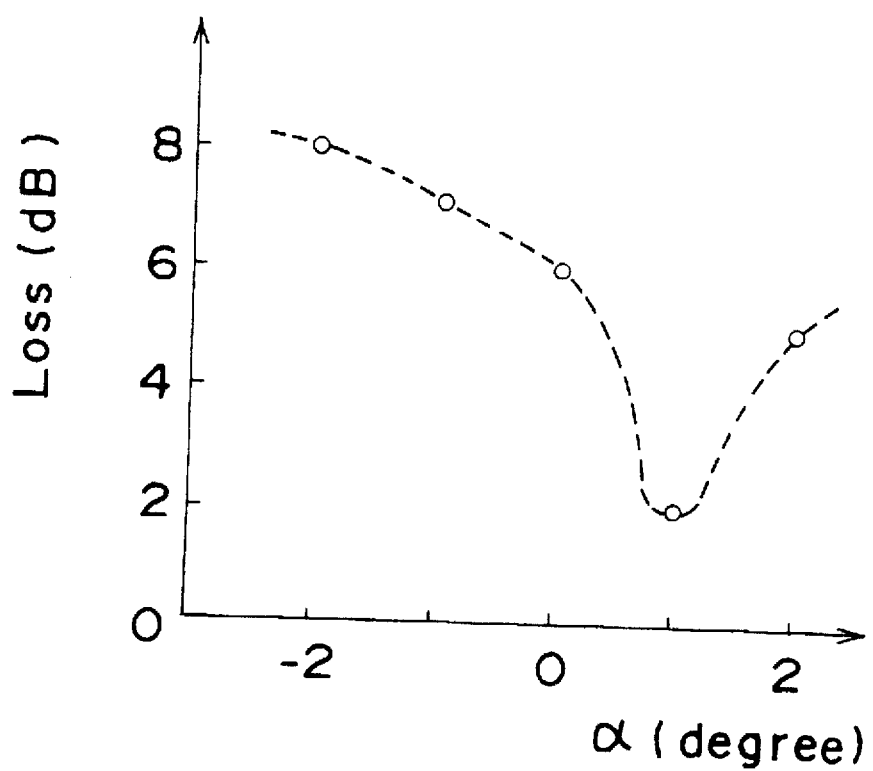
FIG. 3 is a graph illustrating relation between loss and an angle between a transducer shown in FIG. 1 and an externally applied magnetic field.

As can be seen from the results shown in FIG. 3, the loss of the magnetostatic wave device 10 becomes minimum at α=1°. Thus, it is preferred for the above magnetostatic wave device to provide transducers 20, 22 on the thin YIG film at an angle α of 1° with respect to the axis of easy magnetization. However, the angle α is never limited to 1° and is determined to an optimum value according to a strength of the externally applied magnetic field H, a strength of the saturation magnetization of a thin film of magnetic single crystal having a garnet structure, a magnitude and frequency of input signals, and a thickness of the thin film of magnetic single crystal having a garnet structure.

In the preferred embodiment, YIG has been used as a material for thin films of a magnetic single crystal having the garnet structure, but any one of known magnetic materials having the garnet structure may be used therefor.

In the preferred embodiment, there have been used substrates cut along the (011) plane of the single crystal for the production of the magnetostatic wave device 10. However, it is possible to use substrates cut along the (001) plane of the single crystal. In this case, an external magnetic field is applied in the [011] direction or [100] direction and the axis of easy magnetization of the thin magnetic single crystal garnet film is oriented in the [01$\bar{1}$] direction or [0$\bar{1}$0] direction so that magnetostatic waves propagate along the [01$\bar{1}$] direction or the [0$\bar{1}$0] direction. This is supported by the following theoretical considerations.

In a magnetic crystal having the garnet structure, an externally applied magnetic field causes magnetization vectors along some of the rows of axes written as <111> by the representation due to the crystal symmetry, and the direction of the magnetization vector varies with the direction of the externally applied magnetic field. In this specification, it is to be understood that,the representation <111> includes all the axes such as [111], [$\bar{1}$11], [$\bar{1}$11], [1$\bar{1}$1], [$\bar{1}$11], [11$\bar{1}$], [1$\bar{1}$1], and [$\bar{1}$1$\bar{1}$].

Figure 4A:
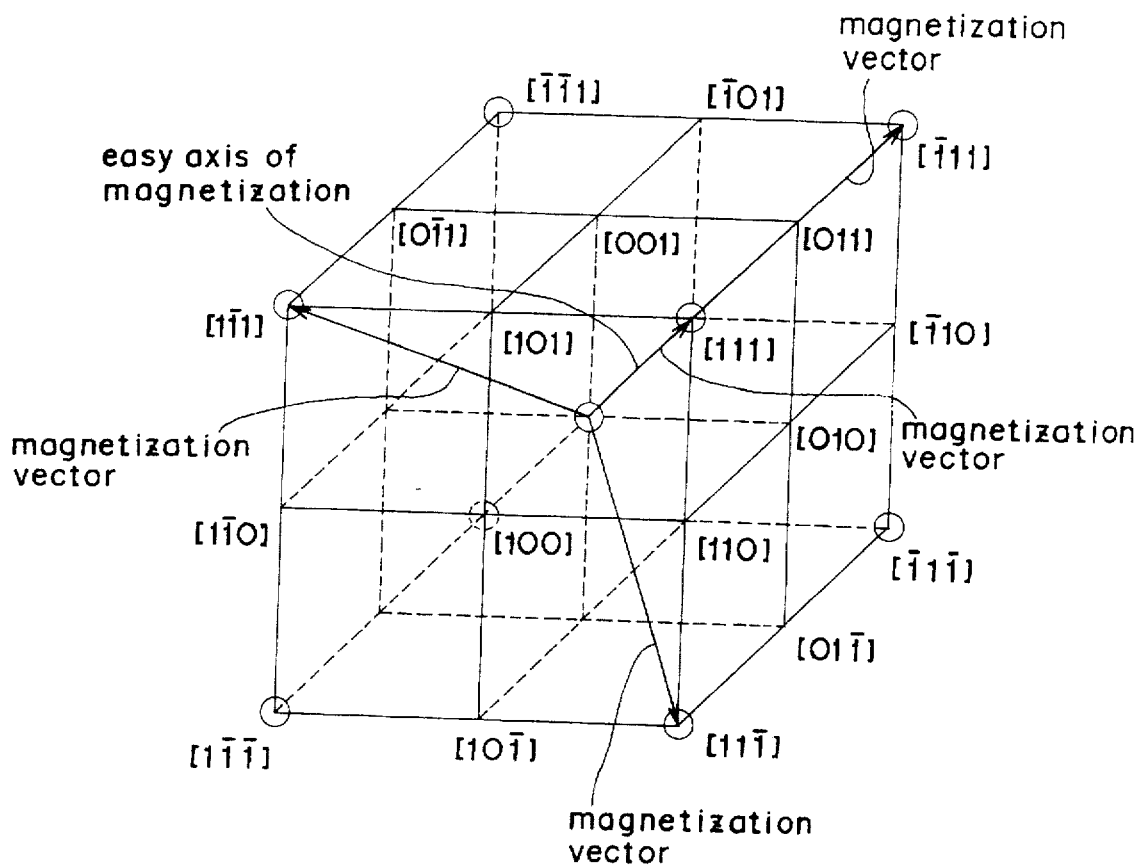
FIG. 4A is a schematic diagram illustrating the directions of magnetization vectors produced when an external magnetic field applied to an YIG single-crystal in [111] direction of the single-crystal.
Figure 4B:
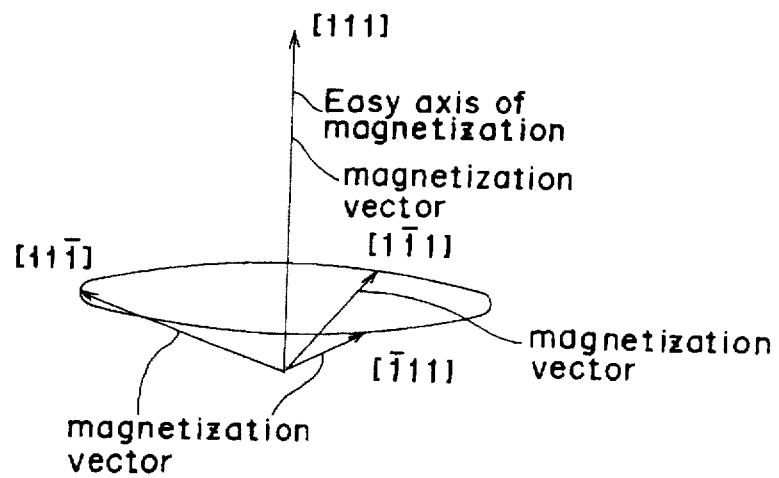
FIG. 4B is a schematic diagram illustrating relations between several magnetization vectors in the YIG single-crystal of FIG. 4A.

In the above case, addition of all the magnetization vectors yields a vector equivalent to the axis of easy magnetization of the magnetic crystal having the garnet structure. For example, if an external magnetic field H is applied in the direction parallel to the [111] axis, the magnetization vectors occur along the axes [111], [11$\bar{1}$], [1$\bar{1}$1] and [$\bar{1}$11], as illustrated in FIG. 4A, 4B, and the axis of easy magnetization of the crystal is equivalent to the vector defined by addition of four magnetization vectors and thus oriented in the [111] direction, i.e., the same direction as that of the external magnetic field H.

On the other hand, if an external magnetic field H is applied in the direction parallel to a plane including [111] and [11$\bar{1}$] (i.e., the ($\bar{1}$10) plane of the crystal), the axis of easy magnetization of the crystal lies in the ($\bar{1}$10) plane as well as the external magnetic field H, though the direction of the axis of easy magnetization differs from that of the external magnetic field H. In this case, if a plane of the crystal film growth is ($\bar{1}$10), the axis of easy magnetization can be oriented in the direction parallel to the single crystal film by applying an external magnetic field H.

Figure 5A:
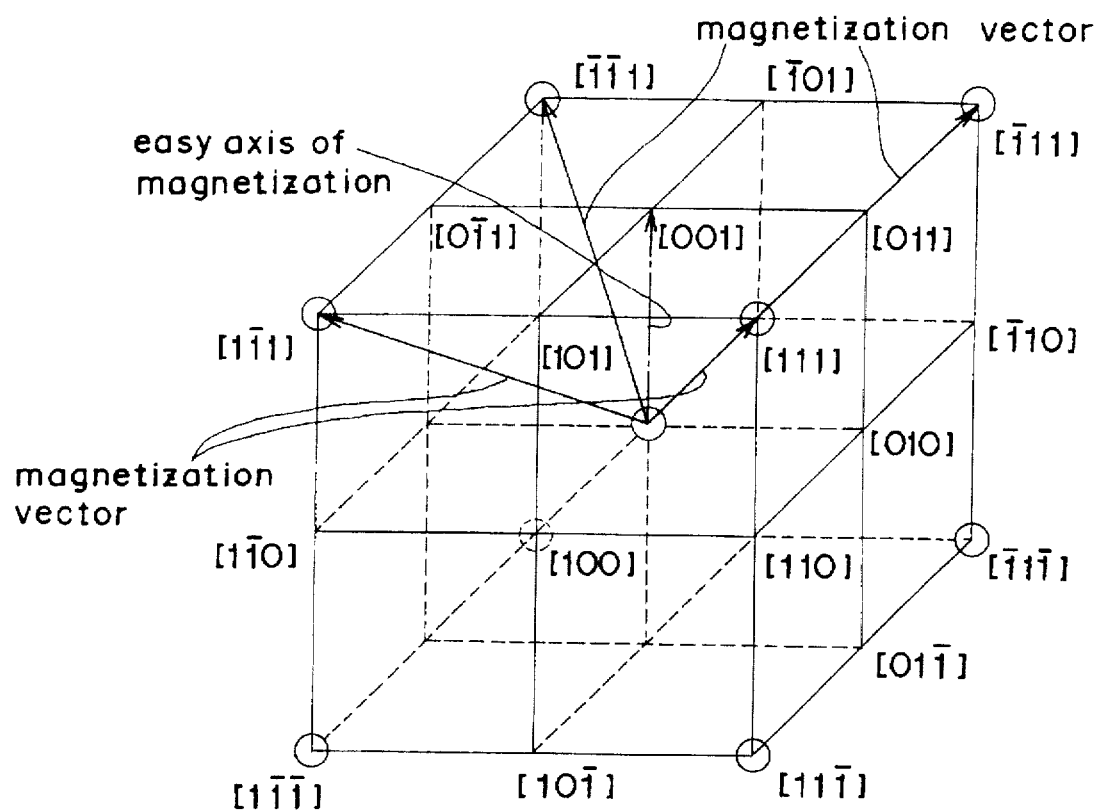
FIG. 5A is a schematic diagram illustrating the directions of magnetization vectors produced when an external magnetic field applied to an YIG single-crystal in [001] direction of the single-crystal.
Figure 5B:
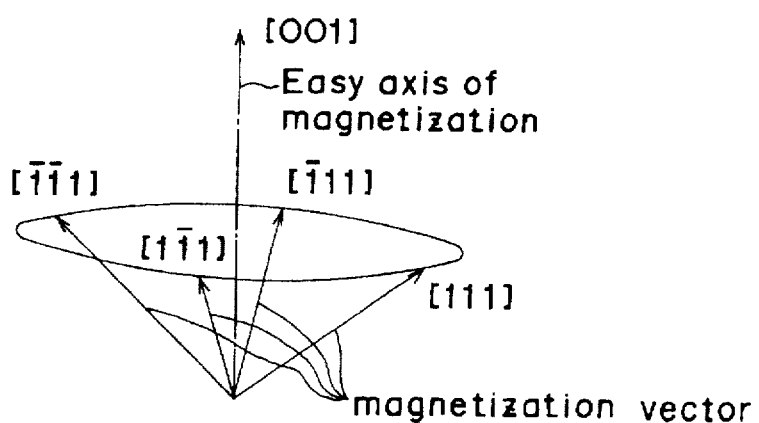
FIG. 5B is a schematic diagram illustrating relations between several magnetization vectors in the YIG single-crystal of FIG. 5A.
Figure 6A:
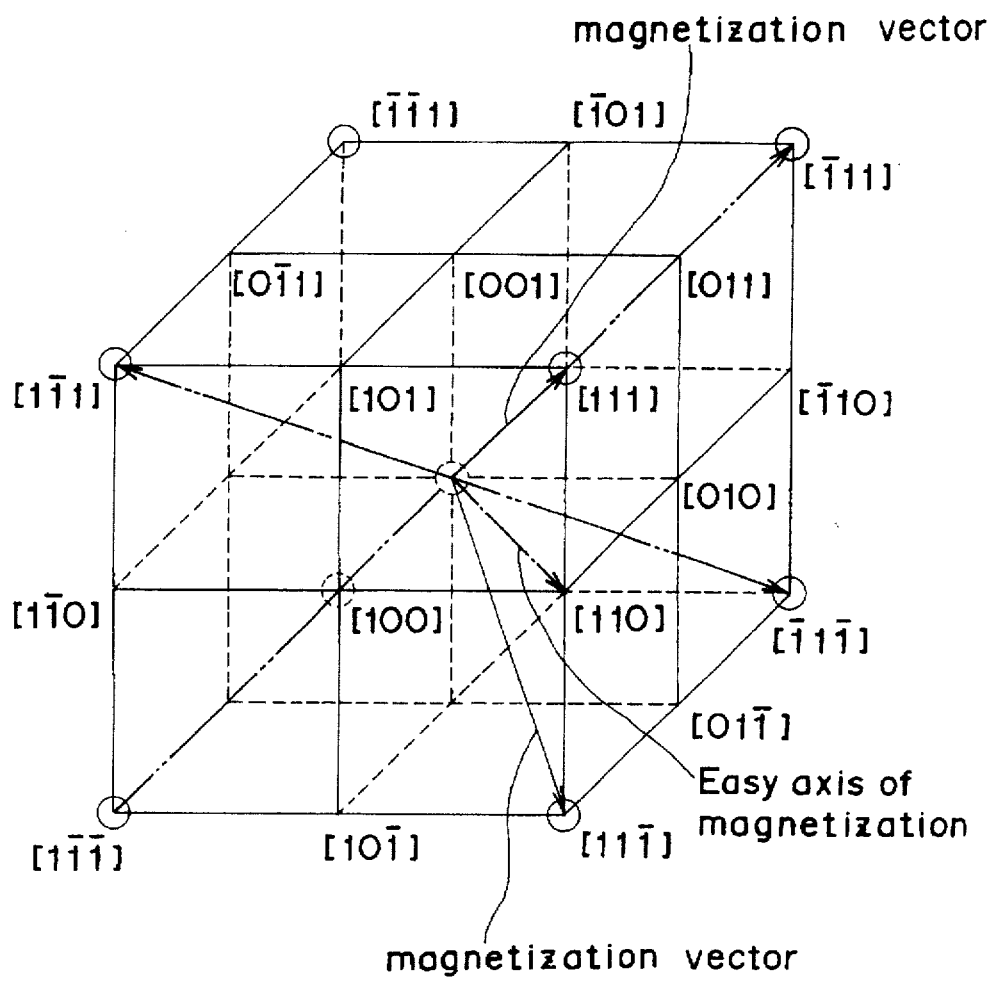
FIG. 6A is a schematic diagram illustrating the directions of magnetization vectors produced when an external magnetic field applied to an YIG single-crystal in [110] direction of the single-crystal.
Figure 6B:
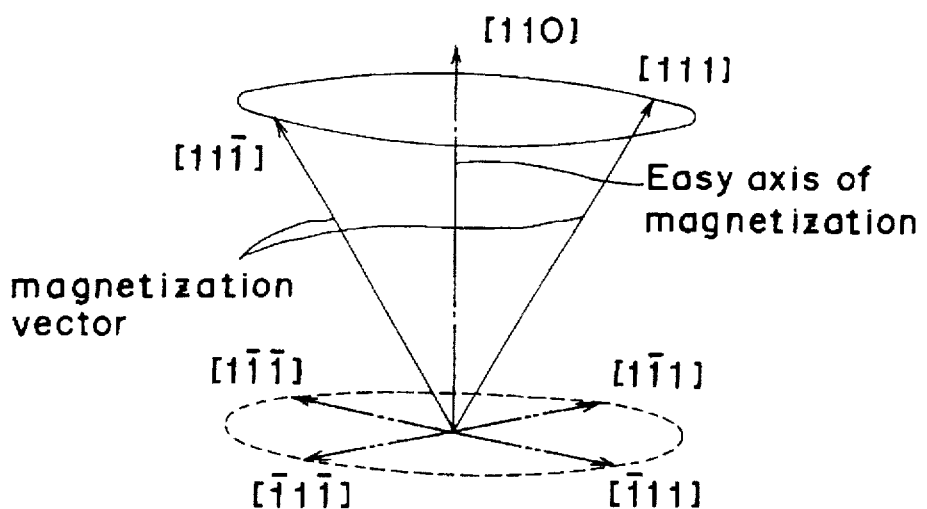
FIG. 6B is a schematic diagram illustrating relations between several magnetization vectors in the YIG single-crystal of FIG. 6A.

Similar results can be obtained even when an external magnetic field H is applied in the [001] direction as illustrated in FIG. 5A, 5B, or in the [110] direction as illustrated in FIG. 6A, 6B.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A magnetostatic wave device of the kind wherein an external magnetic field is applied to a thin film of a magnetic single-crystal having a garnet structure in the direction parallel to a plane of said thin film, characterized in that said thin film of the magnetic single-crystal is formed so as to have an axis of easy magnetization, the direction of which is parallel to the direction of said externally applied magnetic field for providing stability in filtering characteristics.

2. The magnetostatic wave device according to claim 1, further comprising a first transducer for signal inputs located on a principal plane of said thin film of the magnetic single-crystal; and a second transducer for signal outputs arranged in parallel with said first transducer on said principal plane of the thin film of the magnetic single-crystal, said first and second transducers being arranged at an angle relative to the axis of easy magnetization of said thin film.

3. A magnetostatic wave device comprising a thin film of a magnetic single-crystal having a garnet structure, a first transducer for signal inputs formed on said thin film of the magnetic single-crystal, and a second transducer for signal outputs formed in parallel with said first transducer on a principal plane of said thin film of the magnetic single-crystal, wherein said thin film of the magnetic single-crystal is formed on a substrate and has an axis of easy magnetization, the direction of which is parallel to the direction of an external magnetic field applied in the direction parallel to a plane of said thin film for providing stability in filtering characteristics.

4. The magnetostatic wave device according to claim 3, wherein said first and second transducers are arranged on said thin film of magnetic single-crystal at an angle relative to the axis of easy magnetization of said thin film.

5. The magnetostatic wave device according to claim 4 wherein said thin film of the magnetic single-crystal is a magnetic garnet film epitaxially grown on a substrate of gadolinium-gallium-garnet.

6. The magnetostatic wave device according to claim 5 wherein said angle of said first and second transducers falls in the range of −5° to +5°.

7. A magneto static wave device comprising a thin film of a magnetic single-crystal having a garnet structure, a first transducer for signal inputs formed on said thin film of the magnetic single-crystal, and a second transducer for signal outputs formed in parallel with said first transducer on a principal plane of said thin film of the magnetic single-crystal, wherein said thin film of the magnetic single-crystal is formed on a substrate and has an axis of easy magnetization oriented in the same direction as that of an external magnetic field applied in the direction parallel to a plane of said thin film, and wherein said substrate comprises a strip of a single crystal of Gadolinium-Gallium-Garnet cut along a (011) plane thereof, and wherein said film is epitaxialy grown on the (011) plane of said substrate.

8. The magnetostatic wave device according to claim 7, wherein the axis of easy magnetization of the film is oriented in the direction of an [01$\bar{1}$] axis of the crystal.

9. The magnetostatic wave device according to claim 7, wherein said external magnetic filed is applied to the device in a direction parallel to the direction of an [01$\bar{1}$] axis of the single crystal.

10. A magnetostatic wave device comprising a thin film of a magnetic single-crystal having a garnet structure, a first transducer for signal inputs formed on said thin film of the magnetic single-crystal, and a second transducer for signal outputs formed in parallel with said first transducer on a principal plane of said thin film of the magnetic single-crystal, wherein said thin film of the magnetic single-crystal is formed on a substrate and has an axis of easy magnetization oriented in the same direction as that of an external magnetic field applied in the direction parallel to a plane of said thin film, and wherein said substrate is composed of a strip of a single crystal of Gadolinium-Gallium-Garnet cut along a (001) plane of the crystal.

11. The magnetostatic wave device according to claim 10, wherein the axis of easy magnetization is oriented in a direction of an [01$\bar{1}$] or [010] axis of the crystal.

* * * * *